United States Patent [19]

Redl

[11] Patent Number: 5,298,797

[45] Date of Patent: Mar. 29, 1994

[54] GATE CHARGE RECOVERY CIRCUIT FOR GATE-DRIVEN SEMICONDUCTOR DEVICES

[75] Inventor: Richard Redl, Onnens, Switzerland

[73] Assignee: Toko America, Inc., Mount Prospect, Ill.

[21] Appl. No.: 31,223

[22] Filed: Mar. 12, 1993

[51] Int. Cl.$^5$ ............................................ H03K 17/56
[52] U.S. Cl. .................................... 307/246; 307/520; 307/543; 307/573; 328/167
[58] Field of Search ...................... 307/520, 542–543, 307/572–573, 246; 328/167

[56] References Cited

U.S. PATENT DOCUMENTS 4,215,280  7/1980  Mahig .................................. 307/520
5,021,747  6/1991  Isham et al. .......................... 307/568

Primary Examiner—Margaret R. Wambach
Attorney, Agent, or Firm—William E. Hein

[57] ABSTRACT

A gate charge recovery circuit prevents generation of the voltage spike that would otherwise appear across the sense resistor that is employed to detect the current flowing through the switched terminal of a gate-driven semiconductor device when the device is turned on. The gate charge recovery circuit comprises the combination of a capacitor connected between the reference terminal of the semiconductor device and the positive terminal of a driver and a filter resistor connected between the positive terminal of the driver and the positive terminal of a voltage source.

11 Claims, 3 Drawing Sheets

GATE CHARGE RECOVERY CIRCUIT FOR GATE-DRIVEN SEMICONDUCTOR DEVICES

BACKGROUND AND SUMMARY OF THE INVENTION

This invention relates generally to gate-driven semiconductors and more particularly to a gate charge recovery circuit for use therewith. Gate-driven semiconductors widely used in the electronics industry typically include a gate terminal, a reference terminal with respect to which the gate terminal is driven, and a switched terminal. The reference terminal corresponds to the source terminal of a MOSFET or the emitter terminal of an IGBT, for example. Similarly, the switched terminal corresponds to the drain terminal of a MOSFET or the collector terminal of an IGBT. In such semiconductor devices, the driving process involves forcing the gate terminal alternately between a voltage potential to turn the device ON and another voltage potential to turn the device OFF. When the device is ON, the switched terminal exhibits a low impedance characteristic with respect to the reference terminal, whereas when the device is OFF, the switched terminal exhibits a high impedance characteristic with respect to the reference terminal. Since the impedance characteristic exhibited between the gate terminal and the reference terminal is generally capacitive, the process of driving the device from one voltage potential to another is synonymous with forcing a given amount of charge to flow into the gate terminal and out of the reference terminal or vice versa.

In some circuit applications for these devices, it is desirable to detect the current flowing through the switched terminal when the device is ON. This is generally accomplished by inserting a resistor, commonly known as a sense resistor, in series with the reference terminal and detecting the voltage across the sense resistor. This detection method makes use of the approximation that the current flowing out of the reference terminal of the device is representative of the current flowing into the switched terminal of the device. In many applications which use this circuit configuration, the terminal of the sense resistor that is not connected to the reference terminal of the semiconductor device must serve as the ground terminal to provide a common point for one node of a voltage source that is used to drive the device ON.

A general problem with detecting the current flowing through the switched terminal of these gate-driven semiconductor devices is that in the process of turning the device ON, a charge current flows into the gate terminal, out of the reference terminal, and through the sense resistor. As this charge current flows through the sense resistor, a voltage appears across the resistor. Since that voltage is generally present only during a short portion of the full time that the device is ON, it is considered to be a voltage spike. Whereas it is desirable that the voltage waveform across the sense resistor be representative of the current flowing through the switched terminal of the semiconductor device, the voltage spike appearing across the sense resistor represents a deviation from the desired waveform. This voltage spike can present problems in many circuit applications. While attempts have been made to filter the voltage spike, the filtering itself tends to create additional problems.

It is therefore the principal object of the present invention to prevent generation of the voltage spike that would otherwise appear across the sense resistor that is employed to detect the current flowing through the switched terminal of a gate-driven semiconductor device when the device is ON.

This and other objects are accomplished in accordance with the illustrated preferred embodiments of the present invention by providing a capacitor connected between the reference terminal of the semiconductor device and the positive terminal of a driver and a filter resistor connected between the positive terminal of the driver and the positive terminal of a voltage source. As the semiconductor device is turned ON, the capacitor serves to shunt the charge current flowing out of the reference terminal of the semiconductor device back to the positive terminal of the driver, rather than allowing this charge current to flow through the sense resistor. The filter resistor facilitates the shunt function of the capacitor.

DETAILED DESCRIPTION OF THE PREFERRED EMBODIMENTS

Figure 3:
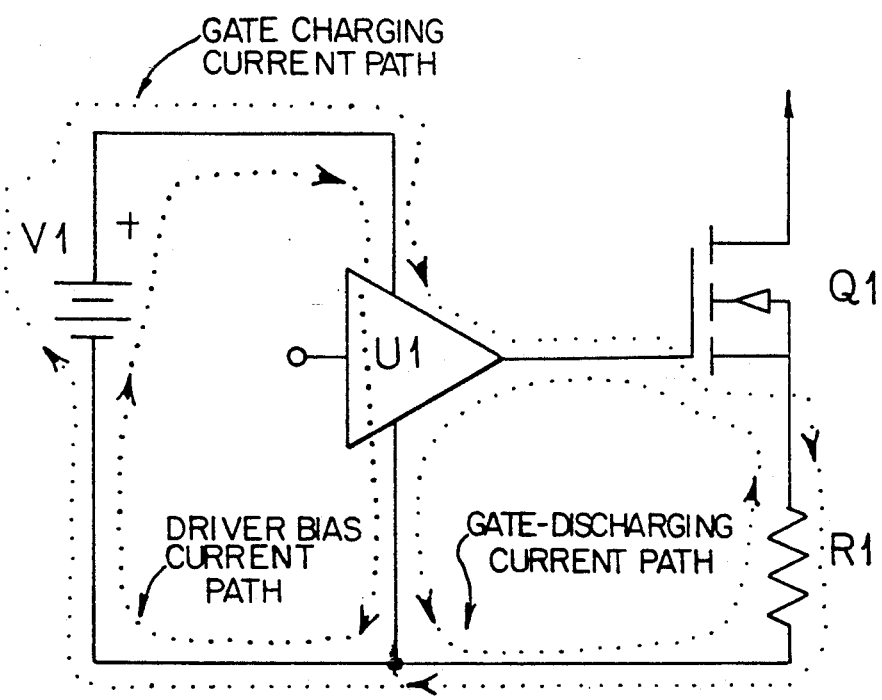
FIG. 3 is a circuit diagram of a prior art application circuit employing a gate-driven semiconductor device.

Referring now to FIG. 3, there is shown a prior art circuit employing a MOSFET Q1 gate-driven by a conventional driver U1 powered by a voltage source V1. A sense resistor R1 is employed to detect the current flowing the source terminal of MOSFET Q1. The waveform of voltage across sense resistor R1 exhibits the undesirable voltage spike illustrated in FIG. 1 when MOSFET Q1 is turned ON. Alternatively, sense resistor R1 may comprise any of a number of conventional current sense devices for detecting current flow. Exemplary of these prior art current sense devices are a current transformer having an output winding terminated by a resistor or a series combination of a rectifier diode and a resistor, a Hall-effect current sensor, and various types of DC current transformers using nonlinear magnetic components. It is a common characteristic of all of these conventional current sense devices that they have a first pair of terminals for carrying the current to be sensed and a second pair of terminals for providing a voltage that is proportional to the sensed current.

Figure 4:
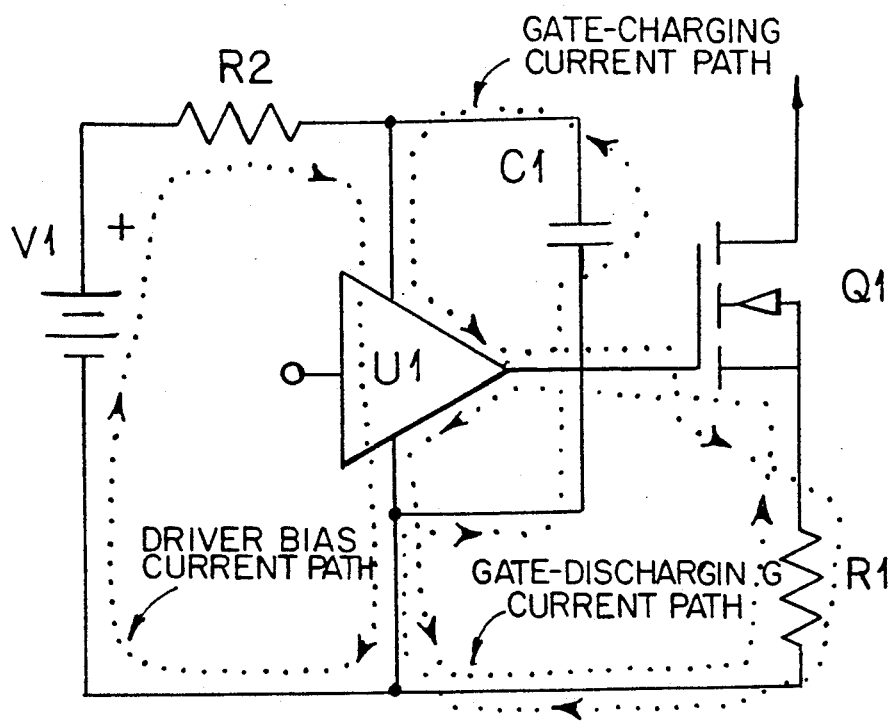
FIG. 4 is a circuit diagram of another prior art application circuit employing a gate-driven semiconductor device.

FIG. 4 illustrates another prior art gate-driven MOSFET circuit configuration in which a resistor R2 and a capacitor C1 are employed to filter the voltage supplied to driver U1 with respect to voltage source V1. This circuit configuration still exhibits the undesirable voltage spike illustrated in FIG. 1 across sense resistor R1 when MOSFET Q1 is turned ON.

Figure 5:
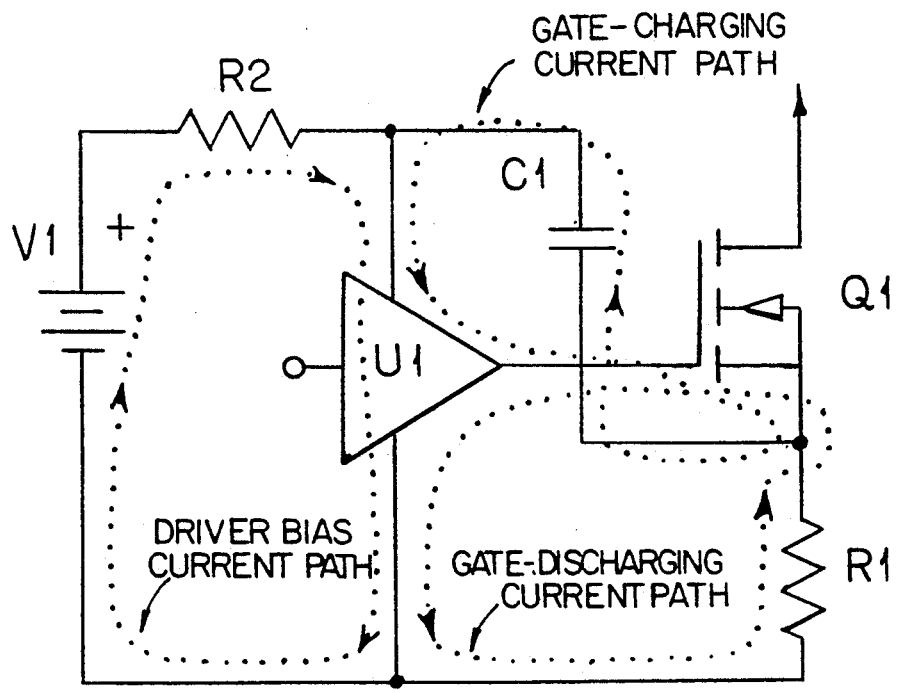
FIG. 5 is a circuit diagram of a gate-driven semiconductor device employing a gate charge recovery circuit in accordance with a first embodiment of the present invention.
Figure 6:
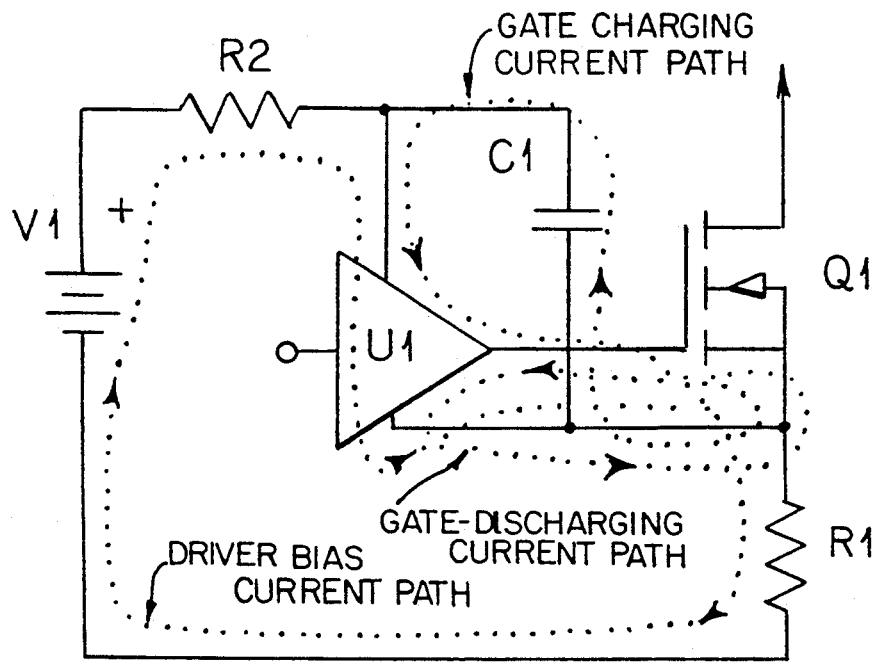
FIG. 6 is a circuit diagram of a gate-driven semiconductor device employing a gate charge recovery circuit in accordance with a second embodiment of the present invention.
Figure 7:
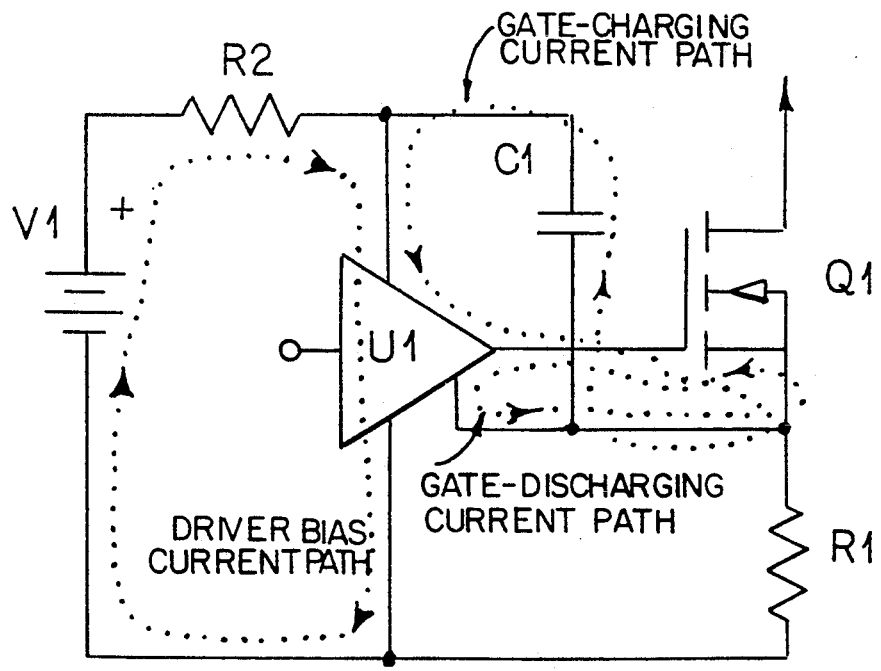
FIG. 7 is a circuit diagram of a gate-driven semiconductor device employing a gate charge recovery circuit in accordance with a third embodiment of the present invention.

Referring now to FIGS. 5-7, there are shown three gate-driven MOSFET circuits in accordance with the present invention in which the gate charging path does not include sense resistor R1. In FIG. 5, a filter element that may comprise a resistor R2 is provided between the positive terminal of voltage source V1 and the positive terminal of driver U1. Alternatively, other well known filter elements, such as an inductor or a voltage-limited current source, may be substituted for resistor R2. A capacitor C1 is connected between the positive terminal of driver U1 and the source terminal of MOSFET Q1. With this circuit, the possibility exists for generation of a negative voltage spike across sense resistor R1 when MOSFET Q1 is turned OFF. However, this negative voltage spike is of little concern compared to the positive voltage spike illustrated in FIG. 1 that occurs when MOSFET Q1 is turned ON in the prior art circuits of FIGS. 3 and 4.

Figures 1, 2:
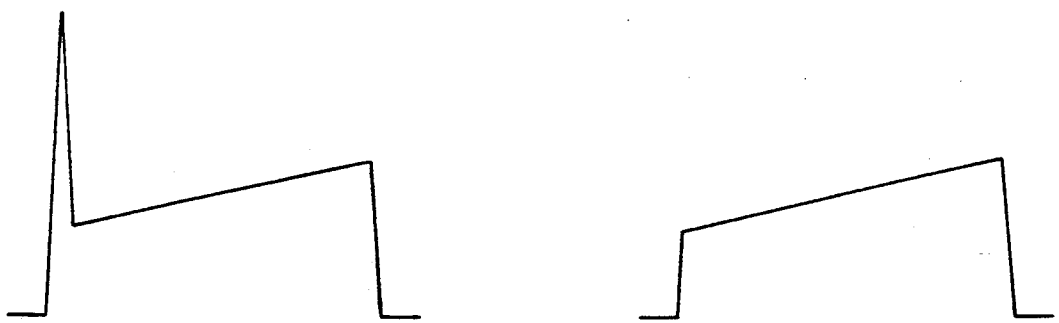
FIG. 1 is a waveform diagram illustrating a typical waveform of voltage appearing across a sense resistor that is employed to detect the current flowing through the switched terminal of a gate-driven semiconductor device as the device is being turned ON, the waveform illustrating the presence of a voltage spike.
FIG. 2 is a waveform diagram illustrating the elimination of the voltage spike of FIG. 1 that is accomplished by the gate charge recovery circuit of the present invention.

The circuit configuration of FIG. 6 eliminates both the undesirable positive voltage spike of FIG. 1 that is exhibited by the prior art circuits of FIGS. 3 and 4, as well as the negative voltage spike that may possibly be exhibited by the circuit of FIG. 5. In the circuit of FIG. 6, the bias current for driver U1 flows through sense resistor R1, thereby creating an inconsequential offset in the waveform of voltage across sense resistor R1. This circuit configuration also exhibits large dynamic excursions in the voltage at the positive terminal of driver U1 with respect to the input terminal of that component. Such voltage excursions can sometimes cause driver U1 to malfunction. The circuit of FIG. 7 employs a signal ground for bias currents that is separate from a power ground for discharging the gate-driven MOSFET Q1 when it is turned OFF. This circuit eliminates the possible disadvantages discussed above in connection with the circuits of FIGS. 5 and 6.

What is claimed is:

1. In a circuit wherein a gate-driven semiconductor device is configured with a current sense device connected between a gate voltage reference terminal of said semiconductor device and a first terminal of a voltage source supplying a gate-driving voltage to said semiconductor device, a gate-driving device having an output terminal connected to a gate terminal of said semiconductor device and having a supply terminal through which current flows to or from said output terminal in order to force said semiconductor device to an ON state, the improvement comprising:

a capacitor connected between said gate voltage reference terminal of said semiconductor device and said supply terminal of said gate-driving device; and a filter element connected between said supply terminal of said gate-driving device and a second terminal of said voltage source.

2. A circuit as in claim 1 wherein said gate-driven semiconductor device comprises a MOSFET.

3. A circuit as in claim 1 wherein said filter element comprises a resistor.

4. A circuit as in claim 1 wherein said filter element comprises an inductor.

5. A circuit as in claim 1 wherein said filter element comprises a voltage-limited current source.

6. A gate charge recovery circuit comprising:

a gate-driven semiconductor device;

a voltage source supplying a gate-driving voltage to said semiconductor device;

a current sense device connected between a gate voltage reference terminal of said semiconductor device and a first terminal of said voltage source;

a gate-driving device having an output terminal connected to a gate terminal of said semiconductor device and having a supply terminal through which current flows to or from said output terminal in order to force said semiconductor device to an ON state;

a capacitor connected between said gate voltage reference terminal of said semiconductor device and said supply terminal of said gate-driving device; and a filter element connected between said supply terminal of said gate-driving device and a second terminal of said voltage source.

7. A circuit as in claim 1 wherein said current sense device includes a first pair of terminals for carrying a current to be sensed and a second pair of terminals for providing a voltage that is proportional to said current to be sensed.

8. A circuit as in claim 6 wherein said gate-driven semiconductor device comprises a MOSFET.

9. A circuit as in claim 6 wherein said filter element comprises a resistor.

10. A circuit as in claim 6 wherein said filter element comprises an inductor.

11. A circuit as in claim 6 wherein said filter element comprises a voltage-limited current source.

* * * * *